(12) United States Patent  (10) Patent No.: US 7,420,495 B2
Shimaya  (45) Date of Patent: Sep. 2, 2008

(54) CURRENT SOURCE CELL ARRANGEMENT AND DIGITAL-TO-ANALOG CONVERTER

(75) Inventor: Hiroshi Shimaya, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/634,249

(22) Filed: Dec. 6, 2006

(65) Prior Publication Data

US 2007/0126617 A1    Jun. 7, 2007

(30) Foreign Application Priority Data

Dec. 7, 2005  (JP) .............................. 2005-353389

(51) Int. Cl.
  *H03M 1/66*  (2006.01)
(52) U.S. Cl. ..................................... 341/144
(58) Field of Classification Search ................ 341/144, 341/145, 146, 150
  See application file for complete search history.

(56) References Cited

U.S. PATENT DOCUMENTS 6,100,833 A * 8/2000 Park ........................... 341/144

6,433,721 B2   8/2002 Katada ........................ 341/144
6,452,527 B2 * 9/2002 Takeya et al. ................ 341/144
6,703,956 B1 * 3/2004 Mueller et al. .............. 341/145
7,026,967 B2 * 4/2006 Eloranta ..................... 341/120

FOREIGN PATENT DOCUMENTS

JP         2002-9247        1/2002

* cited by examiner

*Primary Examiner*—Peguy JeanPierre
(74) *Attorney, Agent, or Firm*—McGinn IP Law Group, PLLC (57) ABSTRACT

An object of the present invention is to form a highly accurate current source for D/A converters. Letters from $a_1$ to $a_n$ where n is at least 4 represent current source cells that output constant currents, each of which is composed of MOS transistors etc. These current source cells are arranged in two dimensional matrix and a plurality of these current source cells are connected to form a current source that has a predetermined current value. Current source cells in any one row of the two dimensional matrix are labeled with letters from $a_1$ to $a_n$. A first kind of row is in the same order as this row. A second kind of row is obtained from the first kind of row by exchanging a series of elements being letters from $a_i$ to $a_{i+j}$ where both i and j are integers at least 1 and i+j is an integer not more than n/2 with a series of elements being letters from $a_k$ to $a_{k+j}$ where k is an integer larger than n/2 and k+j is an integer not more than n. The two dimensional matrix comprises a same number of these two kinds of row.

7 Claims, 7 Drawing Sheets

TOTAL NUMBER OF CURRENT
SOURCE CELLS: 1023

1LSB × 1023 = 1023LSB

FIG.6B

TOTAL NUMBER OF CURRENT
SOURCE CELLS: 21

64LSB × 15 + 32LSB +
16LSB + ··· + 1LSB = 1023LSB

FIG.7  RELATED ART

CURRENT SOURCE CELL ARRANGEMENT AND DIGITAL-TO-ANALOG CONVERTER

FIELD OF THE INVENTION

The present invention relates to a current source cell arrangement and a digital-to-analog (D/A) converter, and more specifically to a current source cell arrangement that reduces influences of variations in characteristics of transistors resulting from manufacturing processes and a D/A converter equipped with the current source cell arrangement.

BACKGROUND OF THE INVENTION

A current addition type D/A converter that converts a digital signal to an analog signal is known. The current addition type D/A converter determines a number of current source cells selected based on a digital signal and adds up output current values of the selected current source cells to output an analog signal.

Figure 5:
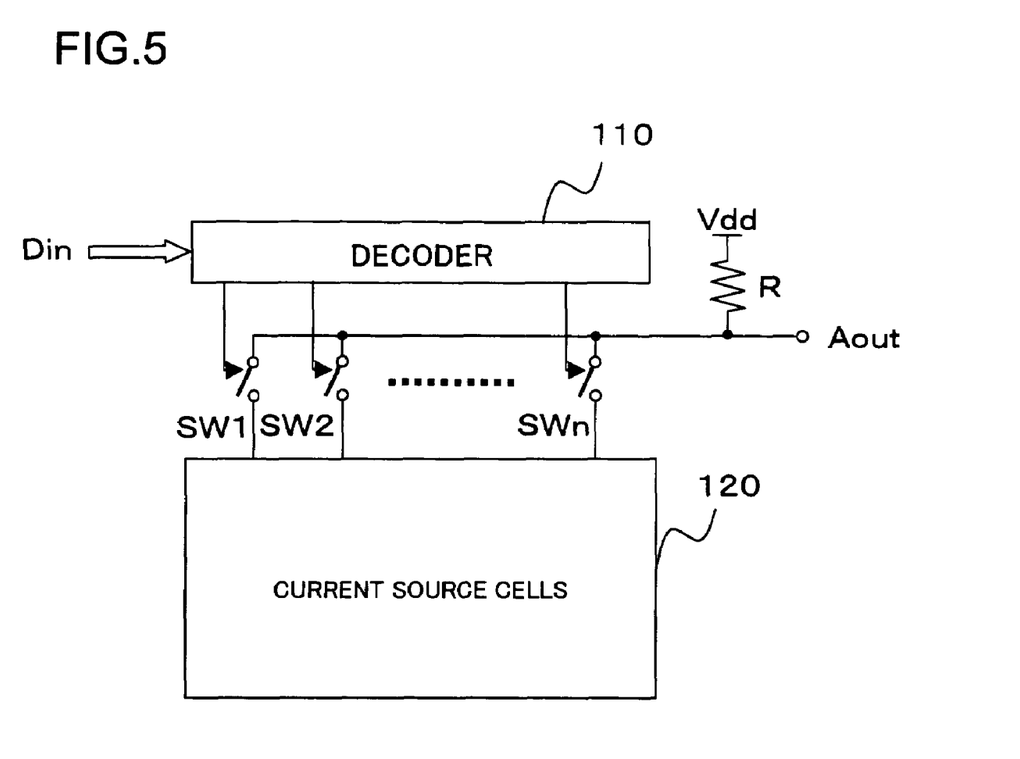
FIG. 5 is a block diagram showing a configuration of a current addition type D/A converter.

FIG. 5 is a block diagram showing a configuration of the current addition type D/A converter. In FIG. 5, a digital signal Din is decoded by a decoder 110 to switch on and off switches SW1 through SWn. Each current output from current source cells 120 respectively is selected by on-state switches SW1 through SWn and added up to flow in a resistance R. A D/A converted analog signal is output as a voltage Aout at one end of the resistance R.

Figure 6A:
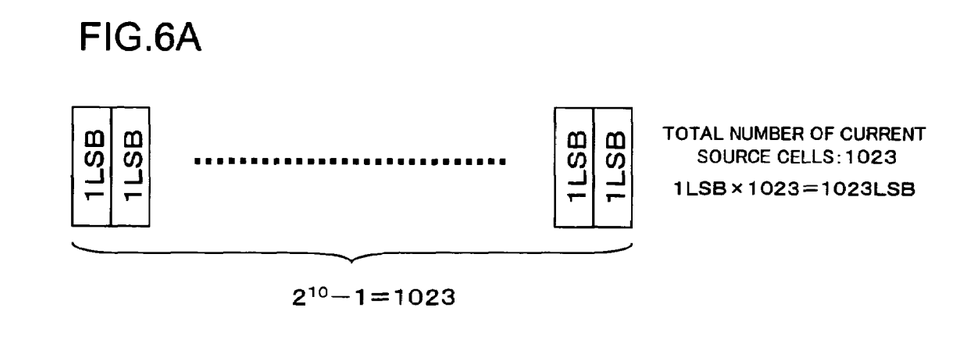
FIGS. 6A and 6B show arrangements of current source cells.

Next, the current source cells 120 are described. The current source cells 120 are composed of a plurality of current source cells each of which outputs a constant current. For example, a 10-bit D/A converter is composed of current source cells that correspond to 1,023 ($2^{10}-1$) LSBs (least significant bits) as shown in FIG. 6A. Output currents from these current source cells are selected by switches operated by an output of the decoder 110. In the decode method, a number of operating switches increases as a value of the binary code increases, which is called a thermometer code, too. In this case, although a linearity error is small, the number of switches SW1-SWn becomes as extremely large as 1,023, which makes implementation difficult.

Figure 6B:
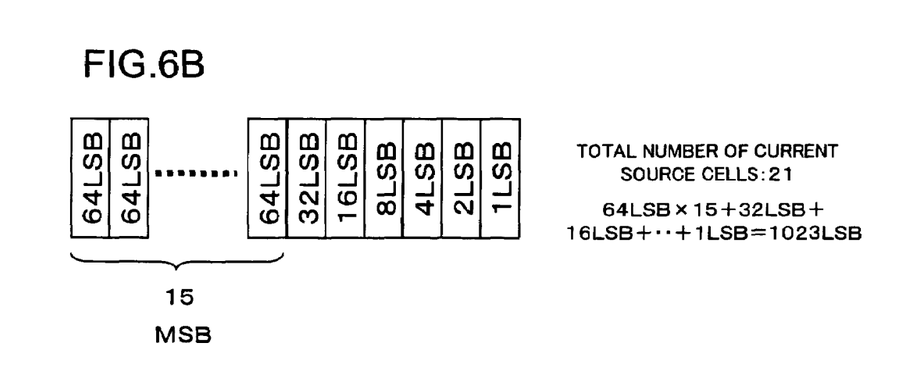

Hence, the D/A converter is usually formed in such a way that lower-order and higher-order bits are expressed by binary and thermometer codes respectively. For example, when a 10-bit D/A converter is formed, as shown in FIG. 6B, current source cells are composed of 15 MSBs (most significant bits), 32 LSBs, 16 LSBs, 8 LSBs, 4 LSBs, 2 LSBs and 1 LSB, each of which is selected by the switches SW1-SWn operated by the output from the decoder 110, where each MSB corresponds to 64 LSBs. In this case, the number of the switches SW1-SWn is 21. Each current source cell with 64 LSBs, 32 LSBs, 16 LSBs, 8 LSBs, 4 LSBs, 2 LSBs or 1 LSB is composed of a constant current source such as a MOS transistor, whose W/L ratio increases with powers of 2.

A current addition type D/A converter as formed above is widely used, because it has merits such as high operating speed, small glitch, loose accuracy requirement for elements and easiness of CMOS fabrication.

From the viewpoint of conversion accuracy, it is ideal that the current addition type D/A converter outputs a constant current value from each of the current source cells that correspond to an MSB. However, in practice, the output current value from each current source cell is not constant, because there is a variation in transistor characteristics originated from the manufacturing process. Therefore, a differential linearity error or a non-linearity (integral linearity) error occurs during the D/A conversion. A magnitude of these errors depends on the variation of the output current from each current source cell.

Figure 7:
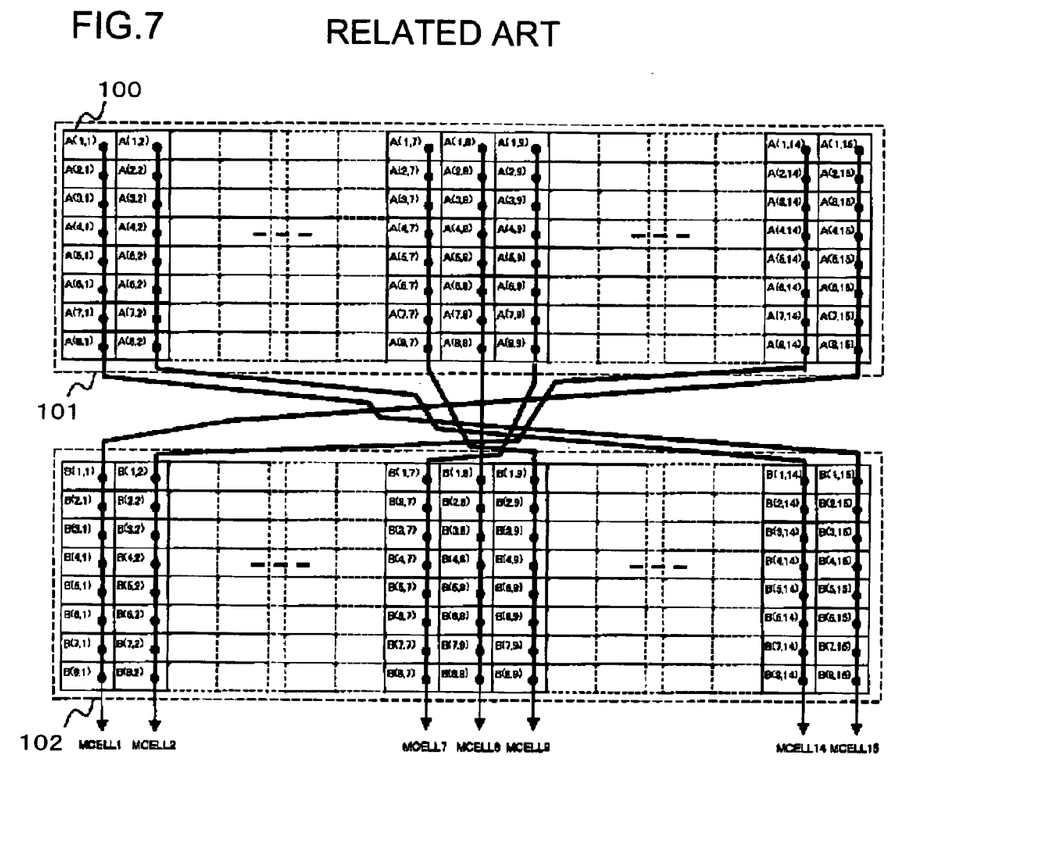
FIG. 7 shows a conventional current source cell arrangement.

Patent document 1, with an assumption that an error in the output current from each current source cell varies (linearly) with a certain inclination along the array direction, discloses a current source cell arrangement that cancels the variation to output a constant current. In the current source arrangement, as shown in FIG. 7, constant current sources MCELL1-MCELL15 are composed of a plurality of current source cells 100 that are arranged in matrix in which each of the current source cells 100 has a predetermined current value and a plurality (group) thereof are combined to provide each of the constant current sources MCELL1-MCELL15. The current source cell matrix is divided into an A-block 101 and a B-block 102 arranged symmetrically with respect to the center of the matrix. The constant current sources are formed by combining equal numbers of the current source cells in each block selected in a row or a column direction.

[Patent Document 1]
JP Patent Kokai Publication NO. JP-P2002-9247A (FIG. 1)

SUMMARY OF THE DISCLOSURE

A close analysis of variations in the current source cell arrangement region in an actual manufacturing process has made it clear that there exist slope-like, mountain-like (or valley-like) and random variations in a rough classification. In the followings, origins of these variations are described.

(1) Slope-Like Variations

The first factor is a mechanical stress during the packaging (sealing) process. When the stress is imposed on a portion of the wafer during the packaging process, characteristics of transistors centered on (near) that portion changes. Even when the stress is imposed on a plurality of portions, magnitude of stress at an edge of the chip is different from that at the center of the chip. When the stress is imposed not on the current source cell arrangement region but on a position far away from that region, a slope-like variation occurs starting from that position.

The second factor is an IR drop caused by a current that flows in a power supply line, which originates not from the process but from the layout design. When the power supply lines are wired in respective order from the right (or left) end of the current source cell arrangement region for example, a slope-like variation in the transistor characteristics occur due to an IR drop from the right (or left) edge. On the other hand, when the power supply line is wired in respective order from both ends of the current source cell arrangement region evenly or from the center of the region to both ends of the region so as to cause an IR drop towards right and left, a mountain-like (or valley-like) variation occurs.

(2) Mountain-Like or Valley-Like Variations

The first factor is the density distribution during a diffusion process with heat treatment. Since the layout design is done in such a way that current source cells are collected basically around a position, transistors are arranged in the current source cell arrangement region and hardly arranged outside the region. When ions are implanted into the current source cell arrangement region during diffusion process, they diffuse from a high-density region to a low-density region. Therefore, in the surrounding area of the region, ions diffuse toward edges of a lower density. Although ions diffuse in the central area of the region, it is thought that the density distribution in the central area is slightly different from those at the edges.

The second factor is the shape of transistors at the edge. Near the center of the current source cell arrangement region, there are neighboring transistors on both sides of a transistor. On the other hand, at the edge of the current source arrangement region there is a neighboring transistor only on one side of a transistor. Therefore, there occurs a variation in shapes of the transistors during a diffusion process. To avoid this influence, dummy transistors are usually arranged at both ends of the current source cell arrangement region. However, there are some cases where these dummy transistors could not be arranged because of a restriction on the layout area. Moreover, although for a transistor near the center there are transistors at the second or third neighboring sites, it may happen that for a transistor in the edge region there are no transistors at these neighboring sites even in the presence of dummy transistors. This leads to a variation in the characteristics (shapes of the transistors).

The third factor is the temperature distribution. Since transistors are arranged around the center of the current source cell arrangement region at a high density, the temperature of the central region becomes higher than that in an marginal region. In this case, if the layout outside the current source cell arrangement region is not taken in the consideration, a variation in characteristics caused by the temperature gradient is mountain-like (or valley-like).

(3) Random Variation

Since the shape of transistors suffers slight differences because of errors due to lens distortion of photolithography facilities, fluctuation in the surface distribution upon ion implantations and fluctuation of oxide film thickness, characteristics of the transistors varies randomly.

The resultant variations in the actual process are a combination of these three variations. A current addition type D/A converter in which output currents from each current source cell are added up reduces influence of the random variation.

Patent document 1 discloses a layout of current source cells that reduces influences of slope-like variations. It is effective to consider slope-like variations in certain case where a layout of D/A converters is predetermined in an occasion, for example, where they are placed at an edge of a custom LSI chip or the like. However, in such a case, e.g., where D/A converters are used as macro cells, their layout on a chip cannot be determined as fixed one. As a Macro cell, a D/A converter is required to demonstrate a predetermined performance regardless of its arrangement of a chip. Therefore, there has been a fear that a high accuracy D/A converter as used in a macro cell could not be provided if only a slope-like variation is considered as is the case with the conventional art.

The present inventor has achieved a current source cell arrangement according to the present invention with a conclusion that a consideration not only on slope-like variations but on mountain-like or valley-like variations in the manufacturing process will broaden the applicability of the arrangement structure in a case where, e.g., a D/A converter is provided as a macro cell.

According to one aspect of the present invention, there is provided a current source cell arrangement. Current source cells are arranged in two-dimensional matrix, a plurality of which are connected to form a current source having a predetermined current value. The current source cells in any one row of the two dimensional matrix are labeled with letters from $a_1$ to $a_n$ (where n is an integer above 4). A first kind of row is in the same order as this row. A second kind of row is obtained from the first kind of row by exchanging a series of elements being letters from $a_i$ to $a_{i+j}$, (where both i and j are integers at least 1 and i+j is an integer not more than n/2), with a series of elements being letters from $a_k$ to $a_{k+j}$ where k is an integer larger than n/2 and k+j is an integer not more than n. The two dimensional matrix comprises a same number of these two kinds of row. Then the current source cells in each rows with a same letter from $a_i$ to $a_{i+j}$ and from $a_k$ to $a_{k+j}$ are connected one by one (each other) throughout (across) all the rows.

According to a second aspect, it is preferred that the first kind row, and the second kind row are present alternatingly in a column direction.

According to a third aspect, it is preferred that the current source cell arrangement comprises a part of the current source cells in each row with a same letter from $a_i$ to $a_{i+j}$ and from $a_k$ to $a_{k+j}$ that are not connected one by one across all the rows.

According to a fourth aspect, it is preferred that current source cells with letters from $a_1$ to $a_{i-1}$ where i is at least 2, from $a_{i+j+1}$ to $a_{k-1}$ where k is at least i+j+2, and from $a_{k+J+1}$ to $a_n$ where k+j is not more than n−1 partially contains dummy current source cells that are not used as the current source cells.

According to a fifth aspect, there is provided a D/A converter comprising the current source cell arrangement according to any one of preceding aspects 1-4, wherein number of the current source cells to be selected is determined according to input digital signals and output current values of the selected current source cells are added up and output as analog signals.

According to a sixth aspect, there is provided a D/A converter comprising the current source cell arrangement according to the third aspect, the D/A converter determining number of current source cells according to input digital signals, adding up output current values of selected current source cells, and outputting analog signals, wherein the current sources correspond to Most Significant Bits MSBs in D/A conversion, and current source cells with less bits than those in MSB are distributed over current source cells being a part of those with letters from $a_1$ to $a_{i-1}$ where i is at least 2, from $a_{i+j+1}$ to $a_{k-1}$ where k is not at least k+j+2, from $a_{k+J+1}$ to $a_n$ where k+j is not more than n−1 and/or over current source cells that are not connected each other across all the rows, or are arranged at any one of these current source cells.

The meritorious effects of the present invention are summarized as follows.

According to the present invention, even when there is a mountain-like or valley-like variation during the manufacturing process, a highly accurate current source can be formed combining current source cells to reduce the variation.

PREFERRED MODES OF THE INVENTION

Figure 1:
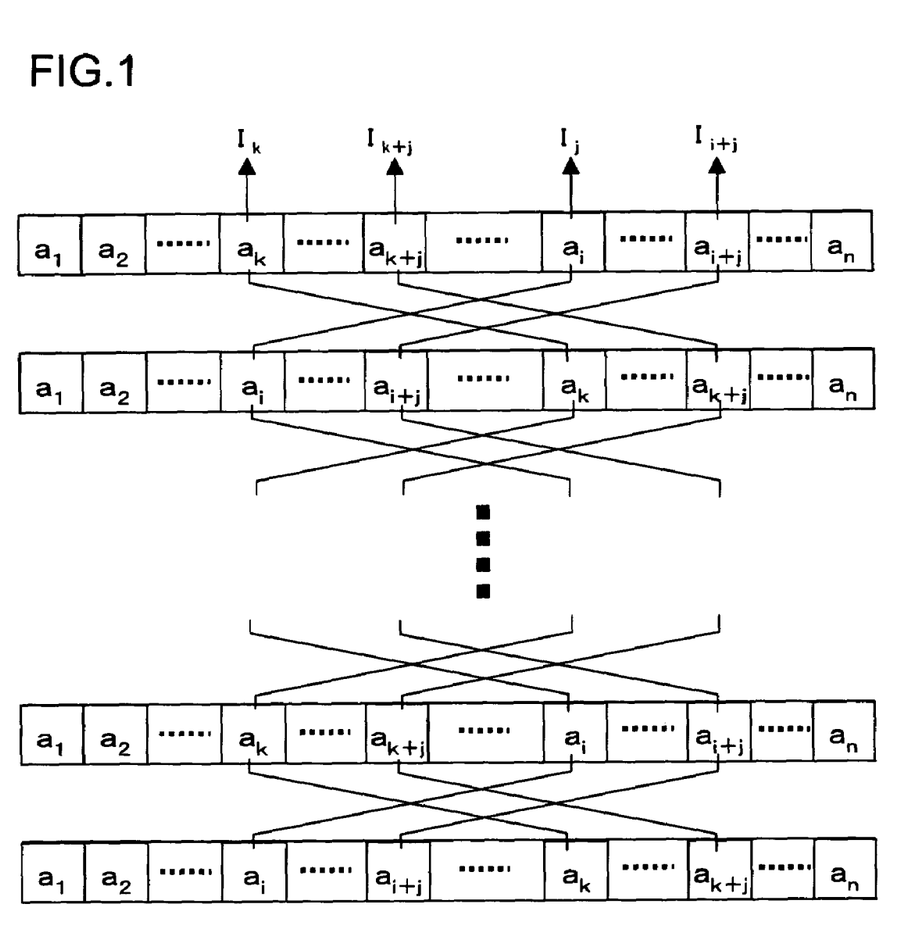
FIG. 1 shows a current source cell arrangement according to an embodiment of the present invention.

FIG. 1 shows a current source cell arrangement according to an example of the present invention. In FIG. 1, $a_1$ through $a_n$ where n is an integer equal to or larger than 4 represent current source cells, each of which is composed of a MOS transistor and the like to output a constant current. These current source cells are arranged in two-dimensional matrix on a semiconductor chip, a plurality of which are connected to form a current source cell arrangement that has a predetermined current value. Current source cells in the first row (the bottom row in FIG. 1) of the two dimensional matrix are labeled with letters from $a_1$ to $a_n$. A first kind of row is in the same order as this row. A second kind of row is obtained from the first kind of row by exchanging a series of elements being letters from $a_i$ to $a_{i+j}$ where both i and j are integers equal to or larger than 1 and i+j is an integer equal to or less than n/2 with a series of elements being letters from $a_k$ to $a_{k+j}$ where k is an integer larger than n/2 and k+j is an integer equal to or less than n. The two dimensional matrix comprises a same number of these two kinds of row. In this case, it is preferable that the first kind of row and the second kind of row exist alternatively in the column direction. Then the current source cells in each rows with same letters from $a_i$ to $a_{i+j}$ and from $a_k$ to $a_{k+j}$ are connected each other throughout all the rows to form a current source to output a current from $I_i$ to $I_{i+j}$ and from $I_k$ to $I_{k+j}$.

When output current values from some current source cells show a mountain-like or valley-like variation in the column direction, they are averaged in such a way that changes separated by a mountain or a valley are cancelled each other combining the current source cells in each zigzag wiring connection across the rows as described above. Even when there is a variation in output current values from any current source cell due to a mountain-like or valley-like variation during the manufacturing process, there is almost no variation among output currents from $I_i$ to $I_{i+j}$ and from $I_k$ to $I_{k+j}$ obtained by combining current source cells in such a specific fashion. Therefore, a high accuracy current source can be formed. Since the current source cells are connected each other throughout all the rows, output currents are not affected by a mountain-like or valley-like variation in output current values from current source cells in the row direction.

The current source cell arrangement comprises a first kind of row labeled with letters from $a_1$ to $a_n$ and a second kind of row obtained from the first kind of row by exchanging a series of elements with letters from $a_i$ to $a_{i+j}$ with a series of elements being letters from $a_k$ to $a_{k+j}$. Since lengths of wires for $a_i$ through $a_{i+j}$ and $a_k$ through $a_{k+j}$ are almost same and IR drops in each wire due to wiring resistance are almost same, there is hardly no variation in the IR drops.

However, in the conventional current source cell arrangement, wires that connect current source cells each other are symmetrical with respect to the center of the matrix. Therefore, length of each wire is not constant and the IR drop due to the wiring resistance is not uniform.

Figure 2A:
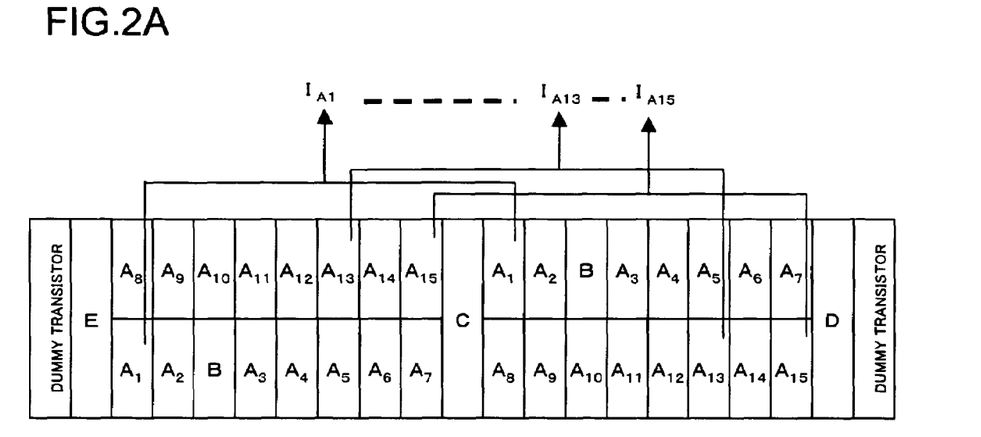
FIGS. 2A and 2B show current source cell arrangements according to an example of the present invention.
Figure 2B:
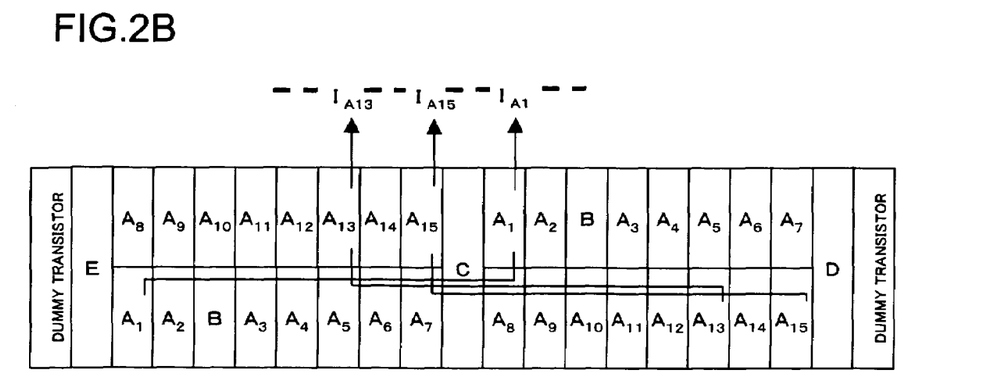

FIGS. 2A and 2B show current source cell arrangements according to an example of the present invention. In FIGS. 2A and 2B, $A_1$ through $A_{15}$, B, C, D and E represent current source cells, each of which is composed of a MOS transistor and the like to output a constant current. As shown in FIGS. 2A and 2B, a (lower) part of a current source cell E, current source cells $A_1$, $A_2$, B and $A_3$ through $A_7$, a (lower) part of a current source cell C, current source cells $A_8$ through $A_{15}$ and a (lower) part of a current source cell D are arranged from left to right in the bottom rows, respectively. And the rest part of a current source cell E, current source cells $A_8$ through $A_{15}$, the rest part of a current source cell C, current source cells $A_1$, $A_2$, B and $A_3$ through $A_7$ and the rest part of a current source cell D are arranged from left to right in the top rows, respectively. Moreover, at both ends of the arrangement, regions for dummy transistors are prepared to avid variations in shape of transistors near the edges of the current source cell during diffusion process.

The current source cells with a same letter among the letters $A_1$ through $A_{15}$ in the top and bottom rows are connected together and output currents from each current source cells are added to output as currents $I_{A1}$ through $I_{A15}$. Although wires are shown only for current source cells $A_1$, $A_{13}$ and $A_{15}$ in FIGS. 2A and 2B to avoid complexity, current source cells $A_2$ through $A_{13}$ and $A_{14}$ are connected in the same way. Since the current source cells $A_1$, $A_2$, B and $A_3$ through $A_7$ and the current source cells $A_8$ through $A_{15}$ in the bottom row are exchanged with each other in the top rows as shown in FIGS. 2A and 2B, the lengths of wires connecting the current source cells $A_1$ through $A_{15}$ are almost the same.

Current source cells that correspond to the fifteen MSBs as shown in FIG. 6B, each of which is composed of 64 LSBs, are arranged to the current source cells $A_1$ through $A_{15}$. Current source cells that correspond to 32 LSBs, 16 LSBs, 8 LSBs, 4 LSBs, 2 LSBs and one LSB are arranged to the current source cells B, C, D and E, respectively, or arranged to one of them. These current source cells comprise current source cells 120 in the D/A converter shown in FIG. 5. Moreover, each output current from these current source cells is selected by switches SW1 through SWn operated by an output from a decoder 110 and added to flow in a resistance R. A D/A converted analog signal is output as a voltage Aout at one end of the resistance R.

A part of current source cells B, C, D and E could be used as a dummy current source cell. Such a dummy current source cell makes it possible to prevent non-uniform transistor density and a variation in the manufacturing process.

In a current source cell arrangement as described above where current sources are arranged in current source cells $A_1$ through $A_{15}$, current sources with same letters and in adjacent rows are connected each other and current values from each current source are added. Therefore, when there is a mountain-like or valley-like variation in shape of transistors of the current source cells of any one of rows due to the manufacturing process, output current values of each current source cell of the different rows are averaged to cancel their variation. As a result, the output current values $I_1$ through $I_{15}$ from current sources arranged to current source cells $A_1$ through $A_{15}$ are almost the same, and errors in the current value can be reduced within 1 LSB.

Figure 3A:
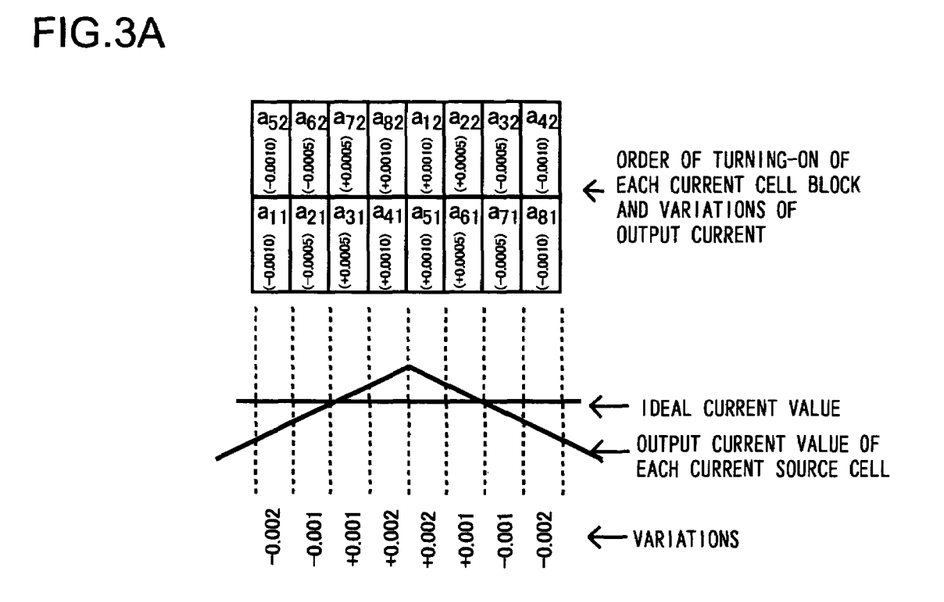
FIGS. 3A and 3B show variations of output current in a current source cell arrangement according to an example of the present invention.
Figure 3B:
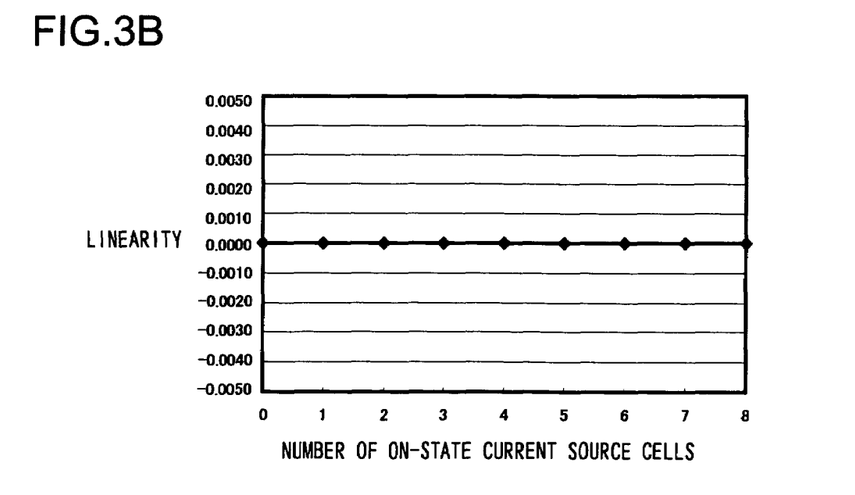

Next, it is explained based on a concrete numerical example how a variation is decreased. FIGS. 3A and 3B show variations of output current in a current source cell arrangement according to an example of the present invention. In FIG. 3A, to make the figure simpler, an example of a variation in the output current values from current source cells a11, a21, a32, a41, a51, a61, a71, a81, a52, a62, a72, a82, a12, a22, a32 and a42 arranged in 8×2 matrix is shown. It is assumed that variations of output currents from each current source cell are, from left to right, −0.001, −0.0005, 0.0005, 0.001, 0.001, 0.0005, −0.0005 and −0.001, respectively, and mountain-like. Pairs composed of current source cells a11 and a12, a21 and a22, . . . , a81 and a82 are wired in common, respectively.

Output currents from each pairs of cells that are connected to the same line are added when it is switched on in the same order as the pair index to output an analog signal. Since variations are canceled between the pairs of current source cells, the error is kept to zero and the linearity is not lost even when the number of on-state current source cells is increased as shown in FIG. 3B.

Figure 4A:
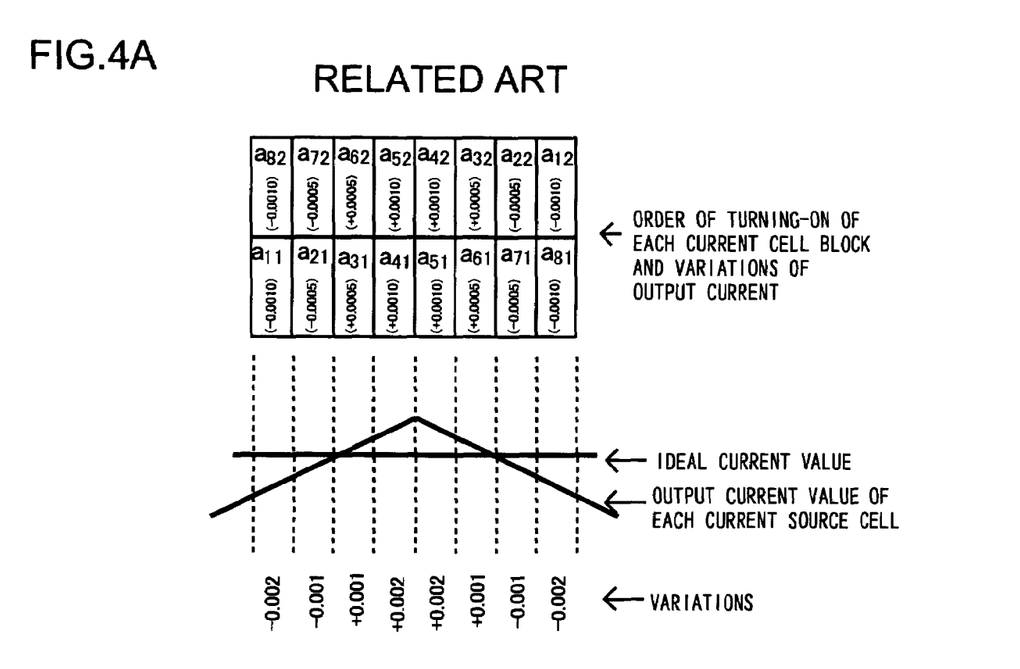
FIGS. 4A and 4B show variations of output current in a conventional current source cell arrangement.
Figure 4B:
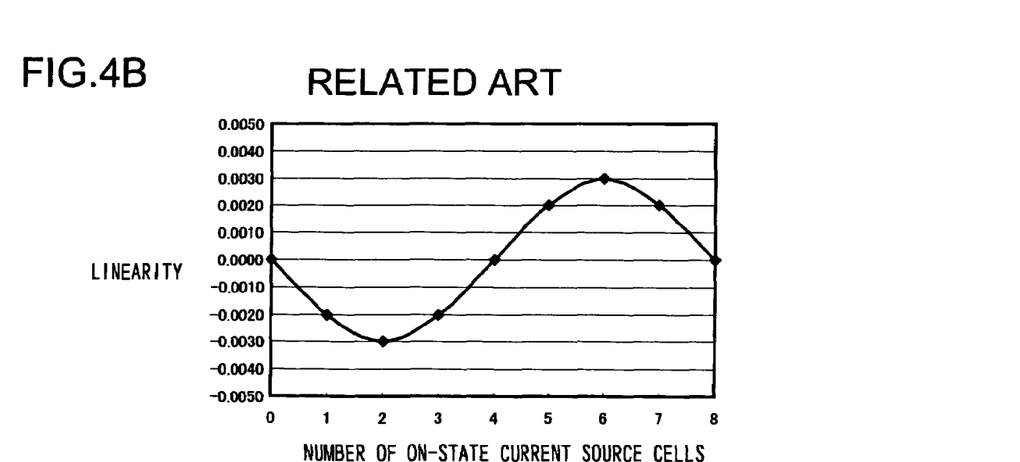

On the other hand, FIGS. 4A and 4B show variations of output current in a conventional current source cell arrangement. When the same condition as in FIGS. 3A and 3B are assumed, an error in the conventional arrangement shows much variation in both plus and minus directions and the linearity is lost.

Although the case with a mountain-like variation in output currents of the current source cell arrangement is considered in the above explanation, the same result is expected for the case with valley-like variations.

In this way, a high accuracy current source is formed with a current source cell arrangement according to an example of the present invention, because the current source cells are combined with each other to reduce a mountain-like or valley-like variation in the manufacturing process. Therefore, a highly accurate D/A converter suitable for a macro cell and the like is realized with the current source cell arrangement.

Although the present invention has been explained according to the above examples, the present invention is not limited to those. It goes without saying that the present invention includes various modifications and variations that persons skilled in the art can do within the scope of the following claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A current source cell arrangement comprising:
   current source cells arranged in a two dimensional matrix,
      a plurality of current source cells being connected to form a current source having a predetermined current value;
   wherein current source cells in any one row of the two dimensional matrix are labeled with letters from $a_1$ to $a_n$, (where n is an integer above 4),
   a first kind of row has a same order as this row, and
   a second kind of row is related to the first kind of row by exchanging a series of elements being letters from $a_i$ to $a_{i+j}$, (where both i and j are integers at least 1 and i+j is an integer not more than n/2), for a series of elements being letters from $a_k$ to $a_{k+j}$ where k is an integer larger than n/2 and k+j is an integer not more than n,
   said two dimensional matrix comprising a same number of these two kinds of row;
   the current source cells in each row with a same letter among letters from $a_i$ to $a_{i+j}$ and from $a_k$ to $a_{k+j}$ are connected one by one across all the rows.

2. The current source cell arrangement according to claim 1, wherein the first kind row, and the second kind row are present alternatingly in a column direction.

3. The current source cell arrangement according to claim 1, the current source cell arrangement comprises a part of the current source cells in each row with a same letter from $a_i$ to $a_{i+j}$ and from $a_k$ to $a_{k+j}$ that are not connected one by one across all the rows.

4. The current source cell arrangement according to claim 1, wherein current source cells with letters from $a_1$ to $a_{i-1}$ where i is at least 2, from $a_{i+j+1}$ to $a_{k-1}$ where k is at least i+j+2, and from $a_{k+j+1}$ to $a_n$ where k+j is not more than n−1 partially contains dummy current source cells that are not used as the current source cells.

5. A digital/analog (D/A) converter comprising the current source cell arrangement according to claim 1, wherein a number of the current source cells to be selected is determined according to input digital signals and output current values of the selected current source cells are added up and output as analog signals.

6. A digital/analog (D/A) converter comprising the current source cell arrangement according to claim 3;
   said D/A converter determining a number of current source cells according to input digital signals, adding up output current values of selected current source cells, and outputting analog signals,
   wherein said current sources correspond to Most Significant Bits (MSBs) in a D/A conversion, and
   current source cells with less bits than those in MSB are distributed over current source cells being a part of those with letters from $a_1$ to $a_{i+1}$ where i is at least 2, from $a_{+j+1}$ to $a_{k-1}$ where k is not at least k+j+2, from $a_{k+j+1}$ to $a_n$ where k+j is not more than n−1 and/or over current source cells that are not connected to each other across all the rows, or are arranged at any one of these current source cells.

7. The current source cell arrangement of claim 1, wherein rows of said second type of row is intermixed with rows of said first type of rows.

* * * * *